United States Patent
Grau

(10) Patent No.: US 10,973,145 B2
(45) Date of Patent: Apr. 6, 2021

(54) FIXING APPARATUS FOR FIXING ONE OR MORE PRINTED CIRCUIT BOARDS TO A HOUSING WALL

(71) Applicant: Liebherr-Elektronik GmbH, Lindau (DE)

(72) Inventor: Hubert Grau, Wasserburg (DE)

(73) Assignee: Liebherr-Elektronik GmbH, Lindau (DE)

( * ) Notice: Subject to any disclaimer, the term of this patent is extended or adjusted under 35 U.S.C. 154(b) by 0 days.

(21) Appl. No.: 16/196,599

(22) Filed: Nov. 20, 2018

(65) Prior Publication Data
US 2019/0166712 A1 May 30, 2019

(30) Foreign Application Priority Data
Nov. 22, 2017 (DE) .................... 10 2017 127 607.6

(51) Int. Cl.
*H05K 7/14* (2006.01)

(52) U.S. Cl.
CPC ......... *H05K 7/1404* (2013.01); *H05K 7/1407* (2013.01); *H05K 7/1418* (2013.01); *H05K 7/1427* (2013.01)

(58) Field of Classification Search
CPC .. H05K 7/1404; H05K 7/1418; H05K 7/1427; H05K 7/1407
See application file for complete search history.

(56) References Cited

U.S. PATENT DOCUMENTS

| 4,318,157 | A | * | 3/1982 | Rank | H05K 7/20545 |
| | | | | | 361/704 |
| 4,775,260 | A | | 10/1988 | Kecmer | |
| 5,003,431 | A | * | 3/1991 | Imsdahl | H05K 7/1404 |
| | | | | | 361/725 |
| 5,224,016 | A | | 6/1993 | Weisman et al. | |
| 5,290,122 | A | | 3/1994 | Hulme | |
| 5,404,274 | A | | 4/1995 | Bond et al. | |
| 5,485,353 | A | * | 1/1996 | Hayes | H05K 7/1404 |
| | | | | | 165/185 |
| 5,607,273 | A | | 3/1997 | Kecmer et al. | |
| 5,779,388 | A | | 7/1998 | Yamamoto | |
| 6,285,564 | B1 | * | 9/2001 | O'Brien | H05K 7/1404 |
| | | | | | 361/759 |
| 8,240,648 | B1 | * | 8/2012 | Pluymers | H05K 7/1404 |
| | | | | | 269/254 CS |
| 2002/0181211 | A1 | * | 12/2002 | Suzumura | H05K 3/202 |
| | | | | | 361/752 |

(Continued)

FOREIGN PATENT DOCUMENTS

DE 691 09 611 T2 9/1995
GB 2 103 020 A 2/1983

*Primary Examiner* — Rockshana D Chowdhury
*Assistant Examiner* — Douglas R Burtner
(74) *Attorney, Agent, or Firm* — Dilworth & Barrese, LLP

(57) ABSTRACT

The present invention relates to a fixing apparatus for fixing one or more printed circuit boards to a housing wall having a frame part that comprises at least one locking means for fixing the frame part to the housing wall and at least one wedge body displaceably supported within the frame part, wherein the wedge body is displaceable into a position relative to the frame part in which a compressive force applied to the frame part by the wedge body deforms the outer frame wall at least regionally outwardly.

18 Claims, 1 Drawing Sheet

(56) References Cited

U.S. PATENT DOCUMENTS

| | | | | |
|---|---|---|---|---|
| 2003/0223197 | A1* | 12/2003 | Hulan | H05K 7/1404 |
| | | | | 361/719 |
| 2007/0253169 | A1* | 11/2007 | Clawser | H05K 7/20545 |
| | | | | 361/720 |
| 2010/0020514 | A1* | 1/2010 | Lee | H05K 7/1404 |
| | | | | 361/801 |
| 2011/0261537 | A1* | 10/2011 | Sporer | H05K 7/20545 |
| | | | | 361/720 |
| 2014/0102626 | A1* | 4/2014 | Clayton | H05K 3/40 |
| | | | | 156/196 |
| 2016/0353597 | A1* | 12/2016 | Gilmore | H05K 7/1404 |
| 2017/0055382 | A1* | 2/2017 | Mastrocola | H05K 7/1404 |
| 2017/0257966 | A1* | 9/2017 | Rozzi | H05K 7/1404 |
| 2018/0206358 | A1* | 7/2018 | Joist | H05K 7/1442 |
| 2018/0320718 | A1* | 11/2018 | Do | H05K 7/1404 |

\* cited by examiner

FIXING APPARATUS FOR FIXING ONE OR MORE PRINTED CIRCUIT BOARDS TO A HOUSING WALL

BACKGROUND OF THE INVENTION

The invention relates to a fixing apparatus for fixing one or more printed circuit boards within a housing.

It is known to assemble printed circuit boards (PCBs) or electronic printed circuit board assemblies (PBAs, PWBs, ICBs) at or within a housing. Such housings are frequently equipped with card slots and with plug-in parts arranged at an end side. Printed circuit board assemblies having complementary plug-in parts are then introduced into the corresponding slots until a plug-in connection has been established.

After the assembly, the printed circuit board assembly has to be properly fixed in the housing. A direct contact between the printed circuit board and the housing wall is frequently also desired to achieve a sufficient heat supply over the housing. This requires that the fixed printed circuit board is pressed against the housing wall with sufficient pressure. Previous solutions in accordance with one of the documents U.S. Pat. Nos. 5,224,016, 5,607,273, 4,775,260, 5,779,388, 5,290,122, and 5,404,274 are very complex in part and frequently cause comparatively high costs. The solutions disclosed there are characterized by a complex construction from a large number of individual components since a separate fixing apparatus is in particular required for every single PCB. The required components are typically produced from metal, which brings along disadvantages with respect to weight and to manufacturing costs.

SUMMARY OF THE INVENTION

It is the object of the present invention to provide a simple fixing apparatus that enables an uncomplicated and inexpensive solution for locking such printed circuit boards at or in a housing of an electrical unit.

This object is achieved by a fixing apparatus in accordance with the features described herein. Advantageous embodiments of the fixing apparatus are also the subject herein.

In accordance with the invention, a fixing apparatus having a frame part is proposed that has at least one locking means for fixing the frame part to a housing wall. The fixing apparatus can accordingly be attached by means of the locking means to an inner wall or to an outer wall of a housing for the reception of one or more printed circuit boards or printed circuit board assemblies. Examples for printed circuit board assemblies include PCBs, PBAs, PWBs, and ICBs.

The locking means is preferably configured such that the fixing apparatus is fixed to the housing wall by force fit or and/or by shape matching.

The frame part itself is hollow to form a wedge body mount whose shape is specifically adapted to the geometry of a wedge body supported therein. This wedge body is displaceably supported within the frame part, with a compressive force being able to be applied to the frame structure by its transposition within the frame part. This force effects an at least regional deformation of the outer frame wall. The slanted plane of the wedge body in particular contacts an inner wall of the frame part. The volume of the wedge body mount of the frame part preferably reduces in the direction of the axis of displacement. The slanted plane of the wedge body presses the frame wall outwardly by transposition of the wedge body in the direction of the reduced volume of the wedge body mount.

The frame part is ideally characterized by a sufficient elasticity to be able to adopt the original shape on a corresponding return transposition of the wedge body.

If the fixing apparatus is attached to or within a housing in direct proximity to at least one printed circuit board, a corresponding compressive force can be applied to the printed circuit board by the deformation of the outer frame wall. The fixing apparatus can accordingly be used to press a printed circuit board against a suitable counter-contact surface, for example against a housing wall, by means of its deformable frame structure. A printed circuit board or a printed circuit board assembly can thus be aligned, stabilized, and fixed within a housing by means of the fixing apparatus. A sufficient contact of an inner housing wall for heat removal can be ensured, for example.

In accordance with a preferred embodiment of the invention, the wedge body extends practically over the total longitudinal axis of the frame part.

There is a possibility of arranging a plurality of wedge bodies in one component, i.e. in a frame part. This not only enables a sufficient production and assembly, but also reduces the required number of components. A very inexpensive and extremely variable solution is therefore provided. The idea in accordance with the invention additionally enables a scalable size adaptation without influencing the production costs.

It is particularly preferred if the wedge body is displaceable relative to the frame part by means of at least one adjustment means accessible from the outside. A suitable adjustment screw is conceivable that is led from the outside through the frame part of the fixing apparatus. The adjustment screw can be a countersunk screw embedded in a bore of the frame part. The screw preferably engages into a corresponding thread of the wedge body and is supported at the frame part with respect to the wedge body. A rotational movement of the adjustment screw in the screwing direction has the result that the wedge body is tightened or transposed in the direction of the screw head or is pressed away from it.

It can be advantageous if the longitudinal axis of the wedge body extends in the longitudinal direction of the frame part. In this connection, a transposition of the wedge body in the longitudinal direction toward the frame part is expedient. The frame part can be formed in the manner of a bar.

A compressive force on at least one frame side can be generated by the wedge body on a corresponding adjustment movement. It is, however, particularly preferred if oppositely disposed frame sides can be synchronously acted on by a compressive force. This can, for example, be achieved by a symmetrical wedge shape, i.e. the wedge body has at least two inclined sides that lie on oppositely disposed frame walls. The synchronous force action results in deformations of the wedge structure at at least oppositely disposed sides. A force can hereby be applied by a single fixing apparatus to at least two printed circuit boards that are adjacent to corresponding deformable sides of the frame part.

In accordance with a particularly preferred embodiment of the invention, the wedge body is sequentially composed of a plurality of wedge-like single segments in the longitudinal direction. A corresponding configuration of the wedge body mount of the frame part having individual part regions for receiving the part segments has the result that individual forces can be applied to the respective sections of the frame part by means of the individual segments. In sum, an almost uniform distribution of the compressive force over the frame side hereby results in the longitudinal direction of the frame part and a comparatively uniform deformation of the frame side is adopted in the longitudinal direction. A printed circuit board extending in parallel with the frame part can thereby also be uniformly acted on by a corresponding force in the longitudinal direction within the housing.

The fixing apparatus in accordance with the invention can be produced comparatively simply and comprises a manageable number of components. In addition to the frame part and the wedge body, only a corresponding adjustment screw, optionally with a threaded insert or a nut is optionally required. It is particularly preferred if the frame part and/or the wedge body are produced as one part. Suitable manufacturing methods, for example, include water jet cutting or laser cutting.

The frame part and/or the clamping body can be produced from plastic, which has an advantageous effect on the total weight.

To lock the fixing apparatus at the housing wall of the electrical unit, the fixing apparatus comprises a groove-like recess in at least one frame side. The fixing apparatus can be mounted, preferably releasably mounted, at a matching rail or at a matching fastening means of the housing wall of an electronic unit by means of said groove-like recess. A groove is particularly preferred which extends in the longitudinal direction and by means of which the fixing apparatus can be pushed onto a complementary rail at the housing wall. A groove that extends in the longitudinal direction and that has a T-shaped or V-shaped cross-sectional profile is particularly preferred. The fixing apparatus can hereby be pushed onto the rail in the longitudinal direction. The T section or V section and the corresponding design of the rail provide its sufficient locking by means of shape matching.

In addition to the fixing apparatus in accordance with the invention, the present invention relates to an electronic unit having at least one housing and at least one printed circuit board or printed circuit board assembly arranged therein. The term printed circuit board is to be understood as an umbrella term for different assemblies such as PCBs, PBAs, PWBs, and ICBs. The electrical unit can, for example be a flange box or a housing in accordance with the ARINC standard. The invention can, however, generally be used wherever at least one printed circuit board is to be mounted at a housing wall.

The housing furthermore comprises at least one fixing apparatus in accordance with the present invention that is arranged by means of the locking means adjacent to at least one printed circuit board at the housing. The position of the fixing apparatus is selected such that a force can be applied to the adjacently disposed printed circuit board by the deformation of the outer frame wall of the fixing apparatus, said printed circuit board thereby being able to be pressed against a counter-contact surface, in particular against a housing wall of the electronic unit. The at least one printed circuit board is accordingly clampable between the counter-contact surface/housing wall and the fixing apparatus. This can equally effect a sufficient contact between the printed circuit board and the housing wall of the electronic unit for heat removal.

A plurality of fixing apparatus, comprising a frame part and a clamping wedge, can be combined or integrated in a component, i.e. housing. This makes possible a simple production and assembly as well as a small number of components. A very inexpensive and extremely variable solution is therefore provided. The idea in accordance with the invention additionally enables a scalable size adaptation without influencing the production costs.

It can be sensible if a rail is provided that extends in parallel with at least one received printed circuit board. The fixing apparatus can be pushed onto this rail for locking purposes by means of its longitudinal groove, in particular its T-shaped or V-shaped longitudinal groove.

Provision can furthermore be made that one or more card guides are provided within the housing of the electronic unit that are elongated in parallel with one another for the insertion of a respective one or also more printed circuit boards. Complementary plugs into which suitable counterplugs of the printed circuit boards can be plugged can optionally be provided at the end side at the card guides. The rail for locking the fixing means preferably extends in parallel with the at least one card guide so that the longitudinal axis of the fixing apparatus also extends in parallel with the card guide and with the received printed circuit board.

The fixing apparatus is advantageously lockable centrally between two printed circuit boards or card guides arranged within the housing. The rail for receiving the fixing apparatus accordingly extends in parallel between two card guides or printed circuit boards. Exactly two printed circuit boards can be pressable against their respective housing wall in this case by a synchronous deformation of oppositely disposed outer frame walls of the fixing apparatus.

BRIEF DESCRIPTION OF THE DRAWINGS

Further advantages and properties of the invention will be explained in more detail in the following with reference to an embodiment shown in the drawings. There are shown.

DESCRIPTION OF THE PREFERRED EMBODIMENTS

Figure 1:
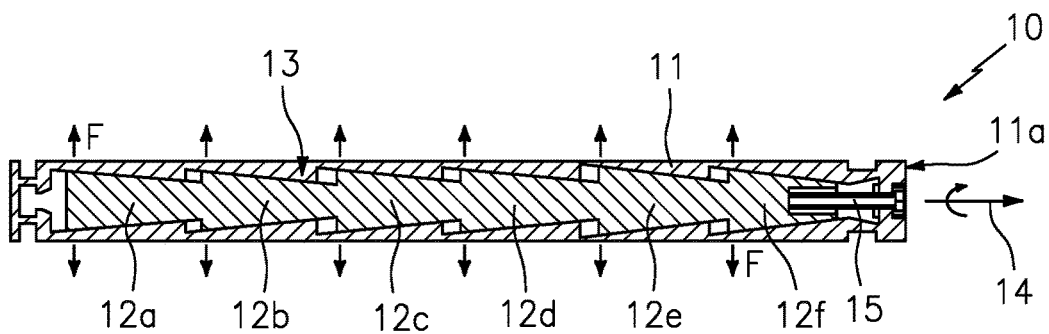
FIG. 1: a longitudinal section through the fixing apparatus in accordance with the invention.
Figure 2:
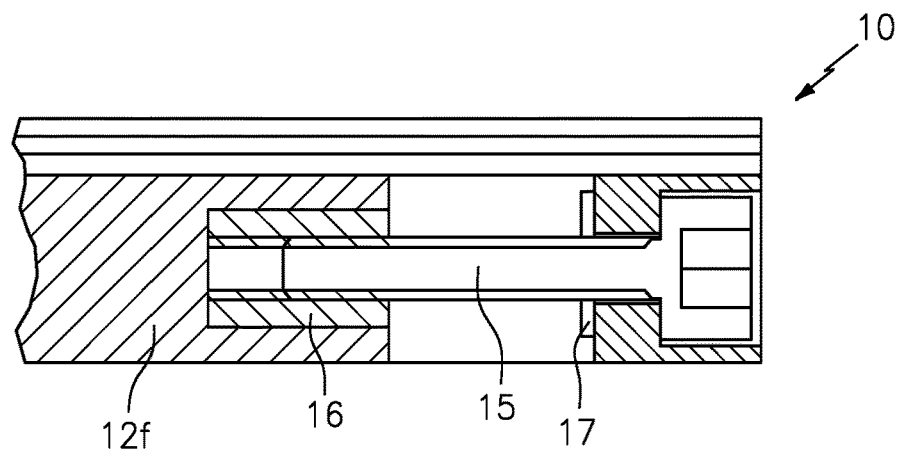
FIG. 2: a detail view of the adjustment means of the fixing apparatus in accordance with the invention.

FIG. 1 shows a longitudinal section through the fixing apparatus 10 in accordance with the invention from an observation perspective from above of the fixing apparatus 10. The fixing apparatus 10 comprises a bar-like frame part 11 having a parallelepiped outer structure. A wedge body 12 displaceable in the longitudinal direction is supported in a longitudinal recess 13 of the frame part 11.

The wedge body 12 comprises a plurality of sequentially connected wedge-like individual segments 12a, 12b, 12c, 12d, 12e, 12f, six in total in the embodiment of FIG. 1. Each individual segment 12a, 12b, 12c, 12d, 12e, 12f has a symmetrical wedge shape whose slanted planes converge in the direction of the axis of the arrow 14 until the next wedge-like segment directly adjoins.

The corresponding recess 13 within the frame part 11 is adapted in an exact fit to the shape of the individual segments 12a, 12b, 12c, 12d, 12e, 12f, i.e. corresponding to each individual segment 12a, 12b, 12c, 12d, 12e, 12f, the recess wall converges in the direction of the arrow 14 toward the center axis of the frame part 11 until the recess again abruptly expands to the original value and is again reduced.

In the starting position, the wedge body 12 is received in an exact fit in the recess 13. If the wedge body 12 is transposed in the direction of the arrow 14, a respective force is applied to the recess wall converging toward the center axis due to the slanted planes of the individual segments 12a, 12b, 12c, 12d, 12e, 12f. The individual forces effected by the individual segments 12a, 12b, 12c, 12d, 12e, 12f are marked by corresponding arrows in FIG. 1.

The force effect brings about a deformation of the frame structure in that the upper side and lower side of the frame 11 shown in FIG. 1 are almost uniformly outwardly arched in the longitudinal direction. The purpose of this deformation will be explained below with reference to FIG. 3.

The adjustment screw 15 serves the adjustment of the wedge body 12 within the frame part 11. This screw 15 penetrates through a front face 11a of the frame part 11, with the screw head being accessibly countersunk in a corresponding recess of the front frame face 11a.

The screw body extends through the recess 13 into a thread 16 embedded in the last individual segment 12f. Depending on the direction of rotation of the screw, the wedge body 12 is either drawn in the direction of the front face 11a or is pushed away therefrom. A good setting and fine adjustment of the frame deformation can hereby be achieved. A securing ring 17 is additionally arranged in the entrance region of the screw 15 into the recess 13.

Figure 3:
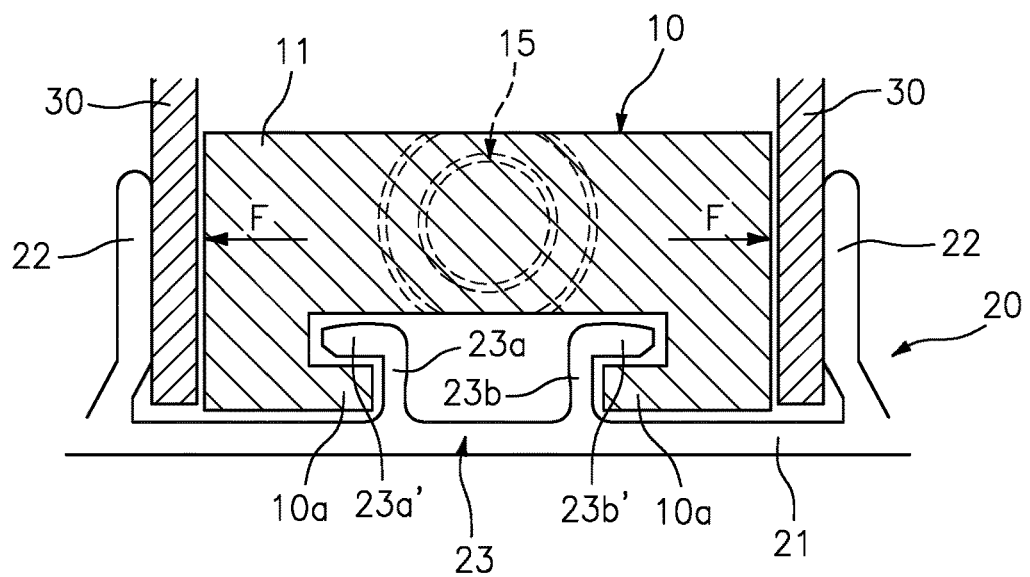
FIG. 3: a sectional representation of the electronic unit disposed transversely to the longitudinal axis and including the fixing apparatus.

The mode of operation for stabilizing one or more printed circuit boards 30 within an electronic unit 20 by means of the fixing apparatus 10 will be explained in the following with reference to FIG. 3. It shows a cross-sectional representation through an electronic unit 20 including printed circuit boards 30 and a fixing apparatus 10. A part section of the housing 20 is shown here. Guide walls 22 can be recognized that stand perpendicular on the housing wall 21 and that extend in the longitudinal direction of the electrical unit and of the printed circuit boards 30, that is, in the plane of the drawing in the representation of the Figure.

A respective printed circuit board 30 leans on these guide walls 22. The locking rail 23 for the fixing of the fixing apparatus 10 that likewise extends in the longitudinal direction centrally between the guide walls 22 is located between the two guide rails 22. The locking rail 23 comprises a rail pair 23a, 23b which extends in parallel and whose upper edge 23a', 23b' is respectively outwardly angled. A T section can alternatively be used here. The fixing apparatus 10 comprises a matching longitudinal groove with a T section, alternatively a V section. The angled upper edges 23a' 23b' engage behind the respective lower edges 10a of the fixing apparatus 10 by pushing the fixing apparatus 10 onto the locking rail 23, whereby a shape match is formed. The fixing apparatus 10 can accordingly only be moved in the longitudinal direction of the rail 23.

In the representation shown, the wedge body 12 likewise extends perpendicular to the plane of the drawing. The adjustment screw 15 is indicated schematically by circles. A force F can accordingly be applied perpendicular to the surface of the printed circuit boards 30 by the adjustment of the wedge body 12, whereby they are pressed against the side guides 22 of the housing 21. Exactly two printed circuit boards 30 or also only one individual printed circuit board can therefore be sufficiently stabilized by means of the fixing apparatus 10 within the electronic unit and can be pressed against the housing wall 22 so that there is a sufficient contact between the printed circuit board 30 and the housing 21 for the desired heat transfer.

The invention claimed is:

1. A fixing apparatus (10) for fixing one or more printed circuit boards (30) to a housing wall (22) and having a frame part (11) having a longitudinal recess (13) therethrough, locking means (23) for fixing the frame part (11) to the housing wall (21), and a wedge body (12) displaceably supported within the recess (13) of the frame part (11), wherein the wedge body (12) comprises around an outer surface thereof, a plurality of sequentially connected wedge-like individual segments (12a, 12b, 12c, 12d, 12e, 12f) each having a symmetrical wedge shape with slanted planes converging in a longitudinal direction (14) until the next wedge-like segment directly adjoins, and the recess (13) through the frame part (11) comprises an outer edge configured to exactly fit the shape of the slanted planes of the individual wedge-like segments (12a, 12b, 12c, 12d, 12e, 12f), such that the wedge body (12) is longitudinally displaceable (14) into a position relative to the frame part (11) in which a compressive force (F) applied to the frame part (11) by the wedge body (12) deforms the outer surface of the frame (11) at least regionally outwardly.

2. A fixing apparatus in accordance with claim 1, wherein the wedge body is movable relative to the frame part by adjustment means.

3. A fixing apparatus in accordance with claim 2, wherein the wedge body extends in the longitudinal direction within the frame part and is displaceable in the longitudinal direction toward the frame part by the adjustment means.

4. A fixing apparatus in accordance with claim 1, wherein a synchronous action of pressure on oppositely disposed frame walls is effected by the wedge body.

5. A fixing apparatus in accordance with claim 1, wherein a uniform action of force on the frame in the longitudinal direction of the frame part is effected by the wedge-like individual segments.

6. A fixing apparatus in accordance with claim 1, wherein the frame part and/or the wedge body are produced as a single part.

7. A fixing apparatus in accordance with claim 1, wherein a groove-like recess of an outer side of the frame part serves as the locking means.

8. An electronic unit having at least one housing and at least one printed circuit board arranged therein, wherein at least one fixing apparatus in accordance with claim 1 is arrangeable adjacent to the at least one printed circuit board at the housing by the locking means such that the at least one printed circuit board is pressable against the housing wall by the deformation of the outer frame wall.

9. An electrical unit in accordance with claim 8, wherein a rail extends in parallel with the at least one received printed circuit board and onto which the fixing apparatus can be pushed by a T groove or V groove is provided at the housing wall.

10. An electrical unit in accordance with claim 8, wherein one or more card guides elongated in parallel with one another are provided within the housing for introduction of the one or more printed circuit boards, with plugs, for matching plugs of the printed circuit boards, being provided at the end side at the one or more card guides.

11. An electrical unit in accordance with claim 8, wherein the fixing apparatus is lockable centrally between two printed circuit boards arranged within the housing so that each printed circuit board can be pressed against a housing wall by the synchronous deformation of oppositely disposed outer frame walls.

12. A fixing apparatus in accordance with claim 1, wherein the frame part (11) is tubular and has a parallelepiped outer surface.

13. A fixing apparatus in accordance with claim 6, wherein the frame part and/or the wedge body are produced by water jet cutting or laser cutting.

14. A fixing apparatus in accordance with claim 6, wherein the frame part and/or the wedge body are produced from plastic.

15. A fixing apparatus in accordance with claim 2, wherein said adjustment means are in the form of an adjustment screw accessible from outside, and
- the wedge body is provided with a thread into which said adjustment screw, led from the outside through the frame part, screws.

16. A fixing apparatus in accordance with claim 7, wherein the groove-like recess extends in the longitudinal direction for pushing the fixing apparatus onto a matching locking rail.

17. A fixing apparatus in accordance with claim 16, wherein the groove-like recess has a T section or a V section.

18. An electrical unit in accordance with claim 10, wherein the plugs provided at the end side at the card guides are complementary to the matching plugs of the printed circuit boards, and a rail for locking of the fixing means is aligned in parallel with the at least one card guide.

* * * * *